United States Patent
Jeppesen

(10) Patent No.: US 9,966,959 B2
(45) Date of Patent: May 8, 2018

(54) FEEDBACK CONTROL SYSTEMS WITH PULSE DENSITY SIGNAL PROCESSING CAPABILITIES

(71) Applicant: Altera Corporation, San Jose, CA (US)

(72) Inventor: Benjamin Peter Jeppesen, High Wycombe (GB)

(73) Assignee: Altera Corporation, San Jose, CA (US)

( * ) Notice: Subject to any disclaimer, the term of this patent is extended or adjusted under 35 U.S.C. 154(b) by 0 days. days.

(21) Appl. No.: 15/214,310

(22) Filed: Jul. 19, 2016

(65) Prior Publication Data
US 2018/0026642 A1    Jan. 25, 2018

(51) Int. Cl.
*H03K 19/177*    (2006.01)
*H03K 19/003*    (2006.01)
*H03K 19/21*    (2006.01)

(52) U.S. Cl.
CPC . *H03K 19/17708* (2013.01); *H03K 19/00346* (2013.01); *H03K 19/21* (2013.01)

(58) Field of Classification Search
None
See application file for complete search history.

(56) References Cited

U.S. PATENT DOCUMENTS

| 5,959,855 | A | * | 9/1999 | Ishii | H02M 7/53875 318/811 |
| 6,009,007 | A | | 12/1999 | Pan | |
| 6,563,393 | B2 | | 5/2003 | Zhang et al. | |
| 7,746,935 | B2 | * | 6/2010 | Bonfiglio | H03F 3/217 327/111 |
| 8,193,719 | B2 | | 6/2012 | Gulsen et al. | |
| 8,547,135 | B1 | | 10/2013 | Yarlagadda et al. | |
| 9,022,037 | B2 | | 5/2015 | Delfyett et al. | |
| 2005/0058209 | A1 | * | 3/2005 | Magrath | H03F 3/217 375/247 |
| 2008/0054825 | A1 | | 3/2008 | Gulsen et al. | |
| 2011/0007907 | A1 | * | 1/2011 | Park | G10K 11/178 381/71.8 |
| 2011/0102223 | A1 | * | 5/2011 | Kinyua | H03F 3/217 341/143 |
| 2013/0058495 | A1 | | 3/2013 | Furst et al. | |

(Continued)

*Primary Examiner* — Douglas W Owens
*Assistant Examiner* — James H Cho
(74) *Attorney, Agent, or Firm* — Treyz Law Group, P.C.; Jason Tsai

(57) ABSTRACT

A feedback control system may include a feedback controller for controlling a plant using pulse density signals. The feedback controller may include a pulse density signal generator and a controller logic circuit. The pulse density signal generator may receive input command signals and generate signed or unsigned pulse density input signals. The controller logic may receive the pulse density input signals from the pulse density signal generator and feedback pulse density signals from the plant and may generate corresponding pulse density control signals for controlling the plant based on the input command signals. The controller logic may include a sign change logic, an addition circuit, and an optional amplifier circuit. The pulse density signal generator may also include rate transition circuits for ensuring that the pulse density input signals and the feedback pulse density signals are uncorrelated.

14 Claims, 10 Drawing Sheets

(56) References Cited

U.S. PATENT DOCUMENTS

2013/0259242 A1* 10/2013 Schuurmans ............ H04R 3/00
  381/56
2015/0091539 A1    4/2015 Norling
2016/0330053 A1* 11/2016 Petrovic .............. H04L 25/4902

* cited by examiner

FEEDBACK CONTROL SYSTEMS WITH PULSE DENSITY SIGNAL PROCESSING CAPABILITIES

BACKGROUND

Systems that include actuators, sensors, motors, or other electronic/mechanical devices often use control signals that need to be adjusted to ensure proper operation. A common way to design such a system is to configure the system in a feedback loop structure. Such a system is typically referred to as a feedback control system.

The basic feedback structure includes the main system process that is being controlled (sometimes referred to as the "plant"), a controller that adjusts the performance of the plant, and a summer that receives an input signal, a feedback signal from the output of the plant, and outputs an error signal to the controller. The error signal is typically generated by subtracting the feedback signal from the input signal and is optionally amplified by a gain factor. The resulting magnitude and polarity of the error signal then determines how the controller should adjust the plant. This type of feedback is also known as negative feedback.

A conventional way of implementing a negative feedback system is via a pure analog approach. For instance, the negative feedback system includes an analog amplifier and an electric motor. The analog amplifier has a positive input terminal that receives an analog input command signal, a negative input terminal that receives a feedback signal from an output of the electric motor, and an output at which a corresponding analog error voltage is generated. The error voltage can be used to directly control a performance parameter of the electric motor, such as the motor's speed or torque. While the analog feedback control system offers minimal delay, it is vulnerable to electrical noise and is difficult to adjust.

It is within this context that the embodiments described herein arise.

SUMMARY

A negative feedback control system based on pulse density signals is provided. In accordance with an embodiment, the feedback control system may include a dynamic subsystem under control (sometimes referred to as a "plant") and a feedback controller. The feedback controller may be implemented using an integrated circuit die such as a programmable integrated circuit device.

The feedback controller may receive input command signals that direct the feedback controller to adjust the performance of the dynamic subsystem in some particular way. The feedback controller may include a pulse density signal generator that receives the input command signals and that generates corresponding pulse density input signals. The pulse density input signals may be unsigned pulse density signals, in which case the pulse density input signals would be a single-bit pulse stream, or may be signed pulse density signals, in which case the pulse density input signals would have an extra sign bit component. The pulse density signal generator may be implemented as a sigma-delta data converter (as an example).

The feedback controller may also include a controller logic circuit that receives the pulse density input signals from the pulse density signal generator. The controller logic circuit may also receive feedback pulse density signals from the dynamic subsystem. The controller logic circuit may then compute the difference between the received signals and output pulse density control signals for dynamically adjusting the plant. The control system may also include an analog-to-digital converter external to the IC die that receives analog signals from the dynamic subsystem under control and that outputs the feedback pulse density signals back to the controller logic within the feedback controller.

In accordance with some embodiments, the pulse density signal generator may include one or more rate transition circuits for ensuring that the pulse density input signals and the feedback pulse density signals are uncorrelated. Assuming that the different pulse density signal streams are uncorrelated, the controller logic can include an addition logic circuit that performs a summing function using logic OR gates and that performs a multiply function using logic AND gates. The use of simple digital logic gates to perform these computations enables the feedback controller to process the pulse density signals with low latency and low noise.

Further features of the invention, its nature and various advantages will be more apparent from the accompanying drawings and following detailed description.

DETAILED DESCRIPTION

Embodiments of the present invention relate to integrated circuits and more particularly, to integrated circuits that can be used in a feedback control system.

In accordance with an embodiment, the feedback control system may include a dynamic subsystem under control and an integrated circuit that serves to adjust the dynamic subsystem. The subsystem may have an output that is converted to single-bit pulse density signals and routed to the integrated circuit via a feedback path. The integrated circuit may receive an analog input signal and convert the input signal to single-bit pulse density signals.

The integrated circuit may also include logic circuits for subtracting the feedback pulse density signals from the input pulse density signals to generate corresponding pulse density control signals that can be used to fine tune the subsystem. As an example, the integrated circuit may be a programmable integrated circuit, which is efficient at processing single-bit signals at high frequency. A pulse density control based feedback system configured in this way can therefore provide low noise, flexibility, and also minimal latency.

It will be recognized by one skilled in the art, that the present exemplary embodiments may be practiced without some or all of these specific details. In other instances, well-known operations have not been described in detail in order not to unnecessarily obscure the present embodiments.

Figure 1:
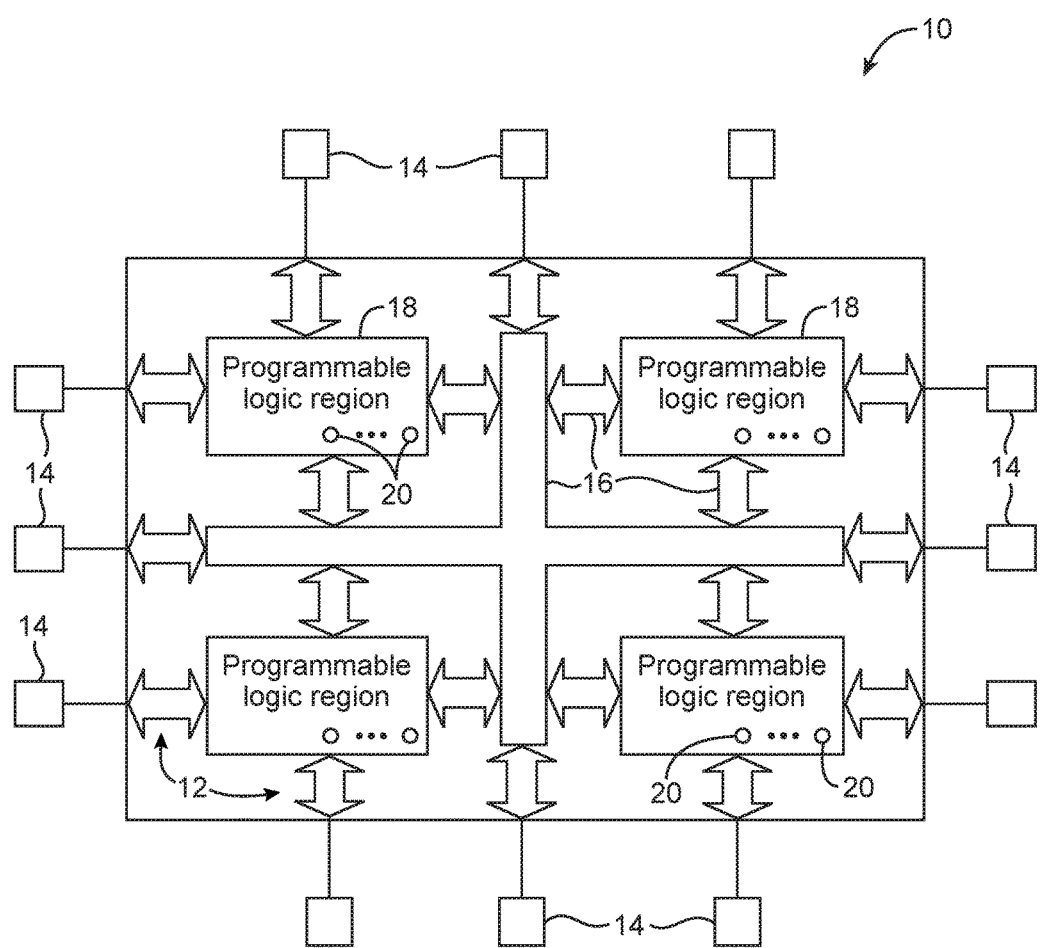
FIG. 1 is a diagram of an illustrative programmable integrated circuit in accordance with an embodiment.

FIG. 1 is a diagram of an illustrative programmable integrated circuit 10. Programmable integrated circuit 10 may include input-output (IO) circuitry 12 for driving signals off of integrated circuit 10 and for receiving signals from other circuits or devices via IO pins 14. Interconnection resources 16 such as global and local vertical and horizontal conductive lines and busses may be used to route signals on integrated circuit 10. Interconnection resources 16 include fixed interconnects (conductive lines) and programmable interconnects (e.g., programmable connections between respective fixed interconnects). The programmable interconnects associated with interconnection resources 16 may be considered to be a part of programmable logic regions 18.

Memory elements 20 may be formed using complementary metal-oxide-semiconductor (CMOS) integrated circuit technology (as an example). In the context of programmable integrated circuit device, memory elements 20 may store configuration data and are therefore sometimes referred to as configuration random-access memory (CRAM) cells. In general, configuration random-access memory elements 20 may be arranged in an array pattern. A user (e.g., a logic designer) may provide configuration data for the array of memory elements during programming operation. Once loaded with configuration data, memory elements 20 may selectively control (e.g., turn on and off) portions of the circuitry in programmable logic regions 18 and thereby customize its functions as desired.

Figure 2:
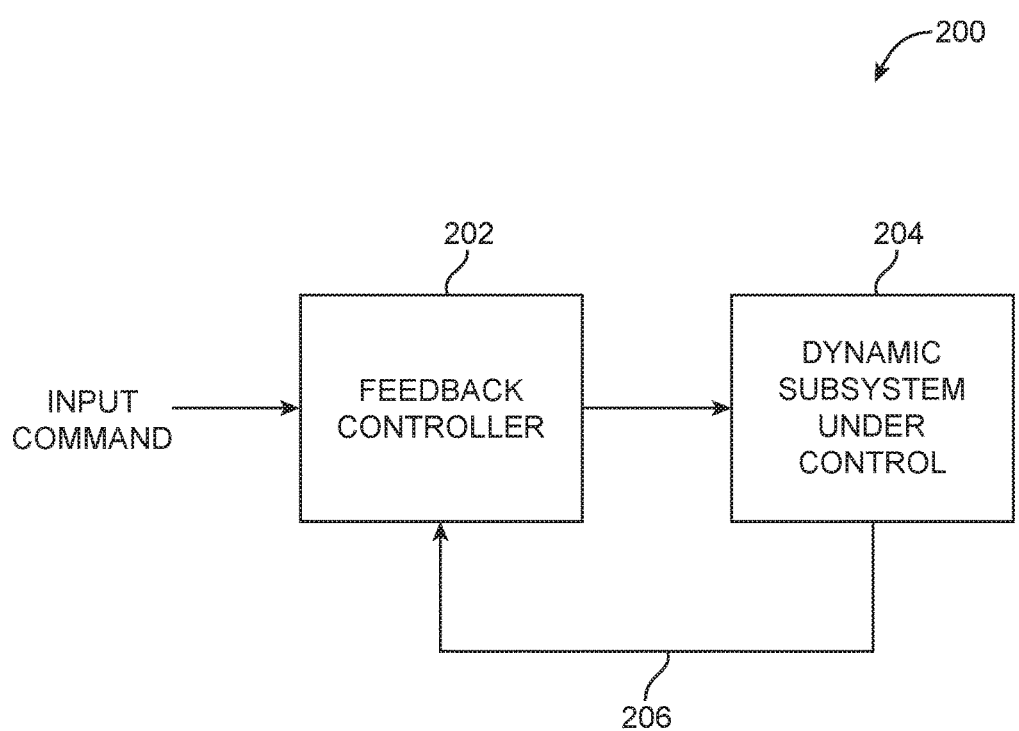
FIG. 2 is a diagram of an illustrative feedback control system in accordance with an embodiment.

Programmable integrated circuit 10 of FIG. 1 can be used in a feedback control system. FIG. 2 is a diagram of an illustrative feedback control system such as system 200. As shown in FIG. 2, feedback control system 200 may include a feedback control subsystem such as feedback controller 202 and a subsystem under control such as dynamic subsystem under control 204. Dynamic subsystem under control 204 may be any electric motor drive, power converter, actuator, sensor, and/or other suitable electrical/mechanical subsystem having a parameter that is monitored and controlled by feedback controller 202. In the context of a control system, dynamic subsystem under control 204 is sometimes referred to as a "plant." As examples, the parameter may be indicative of a speed, distance, location, position, orientation, force, torque, pressure, gain, bit error rate, frequency response, voltage, current, resistance, capacitance, inductance, and any other suitable performance parameter that a user of system 200 may be interested in.

Dynamic subsystem under control 204 may generate an output (which may be proportional to the parameter being monitored) that is fed back to feedback controller 202 via path 206. Feedback controller 202 may also receive an input signal (e.g., an input command signal) that directs feedback controller 202 to adjust the parameter of subsystem 204 in a particular way. Feedback controller 202 may compare the input command signal with the feedback signal to determine how it should adjust system 204. For example, if the input command specifies a motor speed of 1000 revolutions per minute (rpm) while the feedback signal is indicating a current motor speed of 800 rpm, feedback controller 202 will detect this difference and produce a corresponding control signal that increases the speed of the rotary motor until the target rpm is reached. If, however, the current motor speed is at 1100 rpm, feedback controller 202 will detect this difference and produce a corresponding control signal that reduces the speed of the rotary motor until the target speed is obtained.

As described in the Background section, a feedback control system based on a pure analog implementation, while offering minimal delay, is disturbed by electrical noise and not very flexible. In an effort to reduce noise and provide increased flexibility, feedback control systems have been developed that are based on a digital multi-bit implementation.

Consider a scenario in which a feedback controller includes a multibit microprocessor, a pulse width modulation circuit, and an analog-to-digital converter (ADC). The feedback controller may serve to control a power converter that outputs an analog voltage signal, which can be fed back to the ADC. The ADC may convert the analog voltage signal to a 16-bit signal. The microprocessor may receive a 32-bit command signal, compare it with the 16-bit feedback signal to determine the error and compute a new 16-bit output signal for the pulse width modulation circuit. The pulse width modulation circuit then outputs pulse width modulated signals (i.e., digital signals with varying duty cycles) to adjust the power converter accordingly.

While a digital multi-bit feedback control system implemented in this way offers low noise and programmability (since microprocessors can be easily configured to support different applications), the resulting latency is much higher than the analog version. It may therefore be desirable to provide an improved feedback control system that offers low noise, programmability, and minimal latency.

In accordance with an embodiment, feedback control systems may be implemented using a single-bit pulse density signals approach instead of the multibit approach to help eliminate the latency that is associated with multibit conversion, subtraction, and processing.

Figure 3:
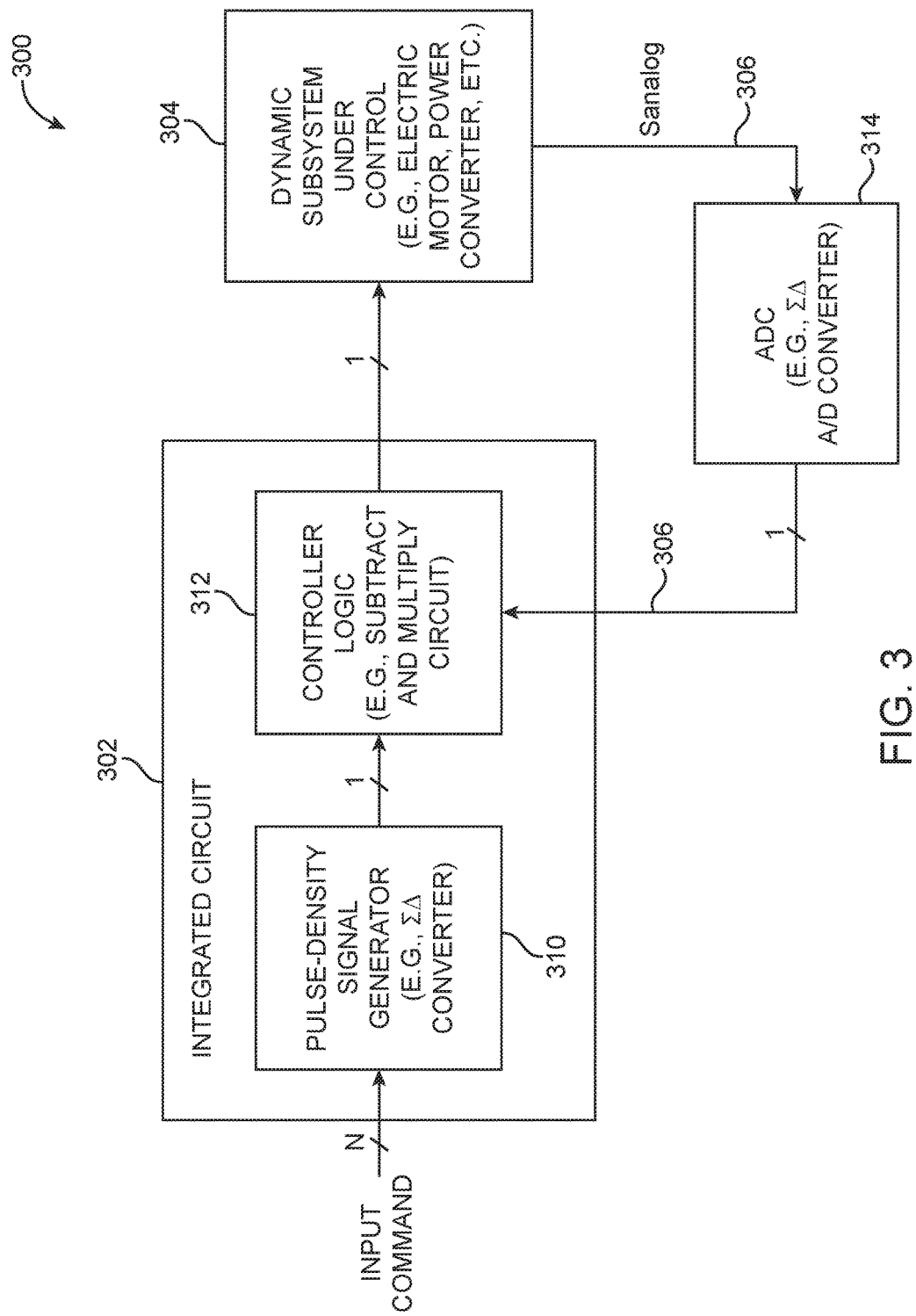
FIG. 3 is a diagram of an illustrative feedback controller based on pulse density signal processing in accordance with an embodiment.

FIG. 3 is a diagram of an illustrative feedback control system such as system 300 based on single-bit pulse density signal processing. As shown in FIG. 3, feedback control system 300 may include a feedback controller implemented using an integrated circuit such as programmable integrated circuit device 302, a dynamic subsystem under control 304 (e.g., an electric motor, actuator, sensor, power converter, voltage regulator, etc.), and a data converter such as analog-to-digital converter (ADC) 314. Subsystem 304 (sometimes referred to as a "plant" in the context of a feedback control system) may output an analog signal Sanalog that is reflective of its current state. Converter 314 (e.g., a sigma-delta analog-to-digital converter) may convert signal Sanalog to single-bit pulse density signals and feed them back to device 302 via feedback path 306.

Feedback controller IC die 302 may include a pulse density signal generator 310 and controller logic 312. Pulse density signal generator 310 may be a sigma-delta converter or other suitable data converter that receives an N-bit input command signal and outputs single-bit pulse density signals.

Controller logic 312 may have a first input that receives the command pulse density signals from generator 310 and a second input that receives the feedback pulse density signals from ADC 314 over path 306. Controller logic 312 may be configured to subtract the two input signals and optionally multiply the resulting difference by a desired gain factor. In addition to comparing the command signals with the feedback signal and multiplying the error by the gain, controller logic circuit 312 may also be configured to perform other mathematical operations such as integrating, differentiating or filtering the error, etc. The final output signal (sometimes referred to herein as pulse density control signals) may then be used to adjust dynamic subsystem 304.

The use of a sigma-delta data converter as generator 310 is merely illustrative and does not serve to limit the scope of the present embodiments. If desired, other types of pulse density generation circuit can be used to provide a 1-bit pulse stream. In accordance with some embodiments, feedback controller 302 may be implemented using the programmable logic device of FIG. 1, which is proficient at converting and processing pulse density signals. For example, a programmable IC die can implement controller logic 312 using "soft" logic (reconfigurable logic), and the required logic resource usage would be low while clock speeds can be high to minimize latency.

The example of FIG. 3 in which a single control signal is being adjusted based on a single feedback signal may be referred to as a single-input, single-output feedback control system and does not serve to limit the scope of the present embodiments. If desired, the techniques described herein can also be extended to multi-input, multi-output (MIMO) feedback control systems, which may produce a number of feedback signals that the controller logic can use to produce several output signals (i.e., MIMO feedback control systems may also be supported using pulse density signals).

Figure 4A:
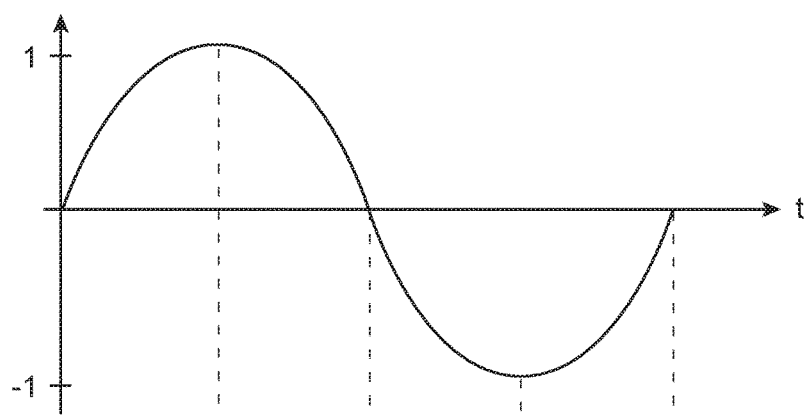
FIG. 4A is a diagram of an exemplary analog input signal in accordance with an embodiment.

FIG. 4A is a diagram of an exemplary analog input signal in accordance with an embodiment. As shown in FIG. 4A, the input signal is a generic sine wave signal oscillating between 1 and −1. This is merely illustrative. In general, the input command signal can have any signal waveform. The input command signal of FIG. 4A is shown as a continuous analog signal but may actually be encoded using discrete N-bit signals (FIG. 3).

Figure 4B:
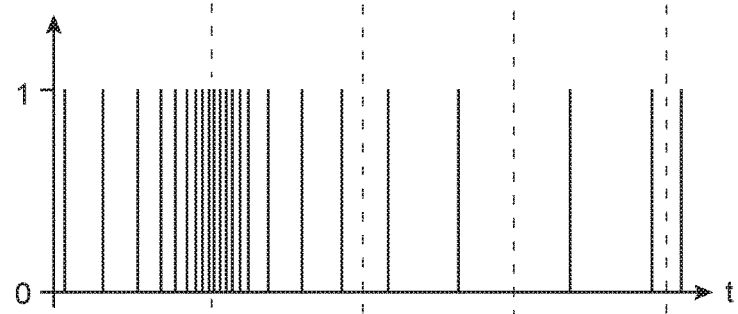
FIG. 4B is a diagram of an unsigned pulse density signal corresponding to the input command signal of FIG. 4A in accordance with an embodiment.

As described above, the feedback controller may convert the continuous analog input signal into corresponding pulse density signals. The pulse density signals may be represented as either unsigned or signed pulse density signals. FIG. 4B is a diagram of an unsigned pulse density signal corresponding to the input signal of FIG. 4A. As shown in FIG. 4B, the unsigned pulse density signal would exhibit the highest density of pulse signals when the input signal is near +1 and the lowest density of pulse signals when the input signal is near −1. The density of pulses will vary as a linear gradient between these two extremes.

Figure 4C:
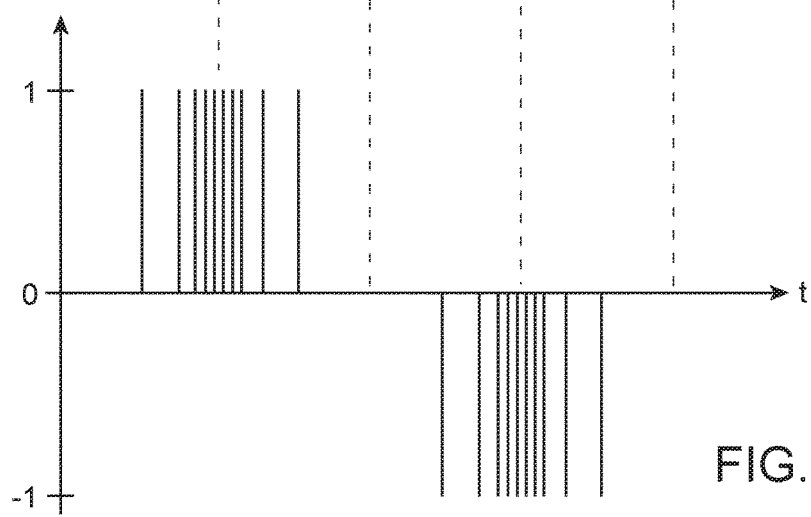
FIG. 4C is a diagram of a signed pulse density signal corresponding to the input command signal of FIG. 4A in accordance with an embodiment.

FIG. 4C is a diagram of a signed pulse density signal corresponding to the input signal of FIG. 4A in accordance with an embodiment. In contrast to FIG. 4B, the pulse density signals of FIG. 4C can be either positive or negative values. As shown in FIG. 4C, when the input signal is positive, only positive pulses will be generated; when the input signal is negative, only negative pulses will be generated. The pulse signals will exhibit the highest density when the magnitude of the input signal is close to one and the lowest density when the magnitude of the input signal is near zero. The density of pulses will vary as a linear gradient between these two extremes. The use of signed pulse density signals will require an additional sign bit. In other words, the circuitry in the feedback control system will need to be able to support a signed pulse density stream. For signed pulse density signals, the first bit can be used to represent the sign (e.g., "0" representing a positive value and "1" representing a negative value), while the second bit represents the magnitude of the pulse.

Figure 5:
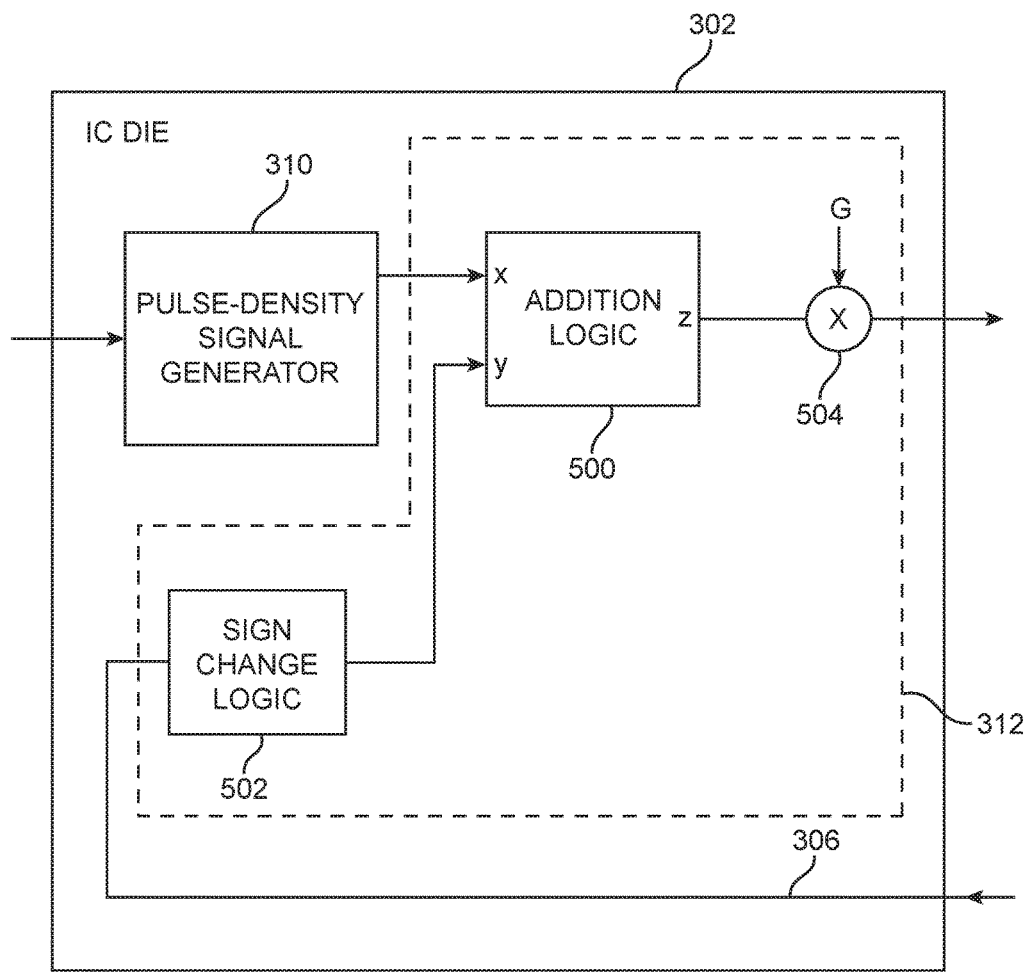
FIG. 5 is a diagram of an illustrative integrated circuit that includes logic for processing pulse density signals in accordance with an embodiment.

System 300 of FIG. 3 can be implemented using either signed or unsigned pulse signals. FIG. 5 is a diagram showing the details of integrated circuit 302. Elements that are the same as or similar to previously discussed elements have the same reference numbers in FIG. 3. The discussion of FIG. 5 can therefore be abbreviated and confined to just the significant differences from what has been previously explained.

As shown in FIG. 5, controller logic 312 may include a summing circuit such as addition logic 500, a sign change circuit such as sign change logic 502, and an optional multiplier circuit such as multiplier 504 that can be used to selectively apply a desired gain to the output of addition logic 500. Use of sign change logic 502 effectively turns logic 500 into a subtraction circuit (since the sign of the feedback signal is inverted using logic 502). In the arrangement in which feedback controller 302 is implemented using a programmable integrated circuit (FIG. 1), at least addition logic 500 and sign change logic 502 may be implemented using soft logic on the programmable IC die.

In order for controller logic 312 to operate properly, it may be desirable to combine pulse density signals that are uncorrelated. In other words, command signals received at the first (x) input of logic 500 should not be correlated with the feedback signals received at the second (y) input of logic 500. In order to ensure that the different pulse density signal streams are uncorrelated, a randomizing function may be used to produce pulse density signals that are not evenly spaced but randomly distributed (e.g., the pattern of the pulse density signals may be altered), random jitter may be introduced to time-shift the signals, and/or multiple timebases may be used for the different pulse density streams (e.g., generator 310 and feedback converter 314 in FIG. 3 may be clocked at different frequencies). These different approaches for ensuring that the different pulse density signal streams are uncorrelated are merely illustrative. If desired, other ways of uncorrelating the different pulse streams may be used.

Assuming the different pulse streams are uncorrelated, the logic used to process these uncorrelated pulse signals becomes fairly simple. For example, the addition operation can be supported using a logic OR gate. As another example, the multiply operation can be supported using a logic AND gate. As yet another example, a simple NOT function on input s can be used to compute 1−s or to approximate 1/s.

In accordance with an embodiment, a signed pulse density signal k may have a sign component kNeg and a pulse magnitude component kPulse. Signal k, which is equal to {kNeg, kPulse}, may be encoded as follows:

{0,0}=0

{0,1}=+1

{1,1}=−1

{1,0}=NaN (Not a Number)

Encoded in this way, a sign bit of one with a pulse magnitude of zero can be used for specifying special error cases for error checking purposes. If desired, however, {1,0} can also be used to represent k=0. The logic implementations shown in the following figures take advantage of the encoding where {1,0} is never used except in the case of an error to help avoid any ambiguity between {0,0} and {1,0}.

Figure 6:
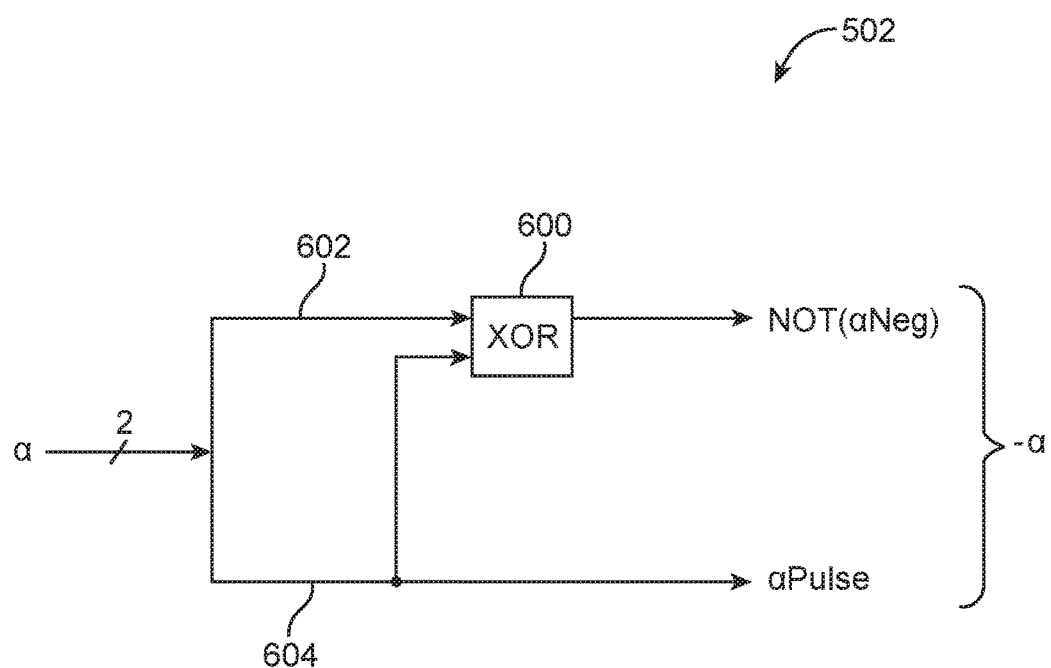
FIG. 6 is a diagram of an illustrative pulse density signal sign change logic circuit in accordance with an embodiment.

FIG. 6 is a diagram of an illustrative pulse density signal sign change logic circuit 502. As shown in FIG. 6, sign change logic 502 may receive a signed pulse signal α and may split the signal into a first sign component 602 and a second pulse component 604. The sign component may be combined with the pulse component using a logic exclusive-OR ("XOR") circuit 600 to generate inverted sign component NOT(αNeg). The pulse magnitude component passes directly through as αPulse. The resulting components NOT(αNeg) and αPulse represents a negative version of input signal α.

Figure 7:
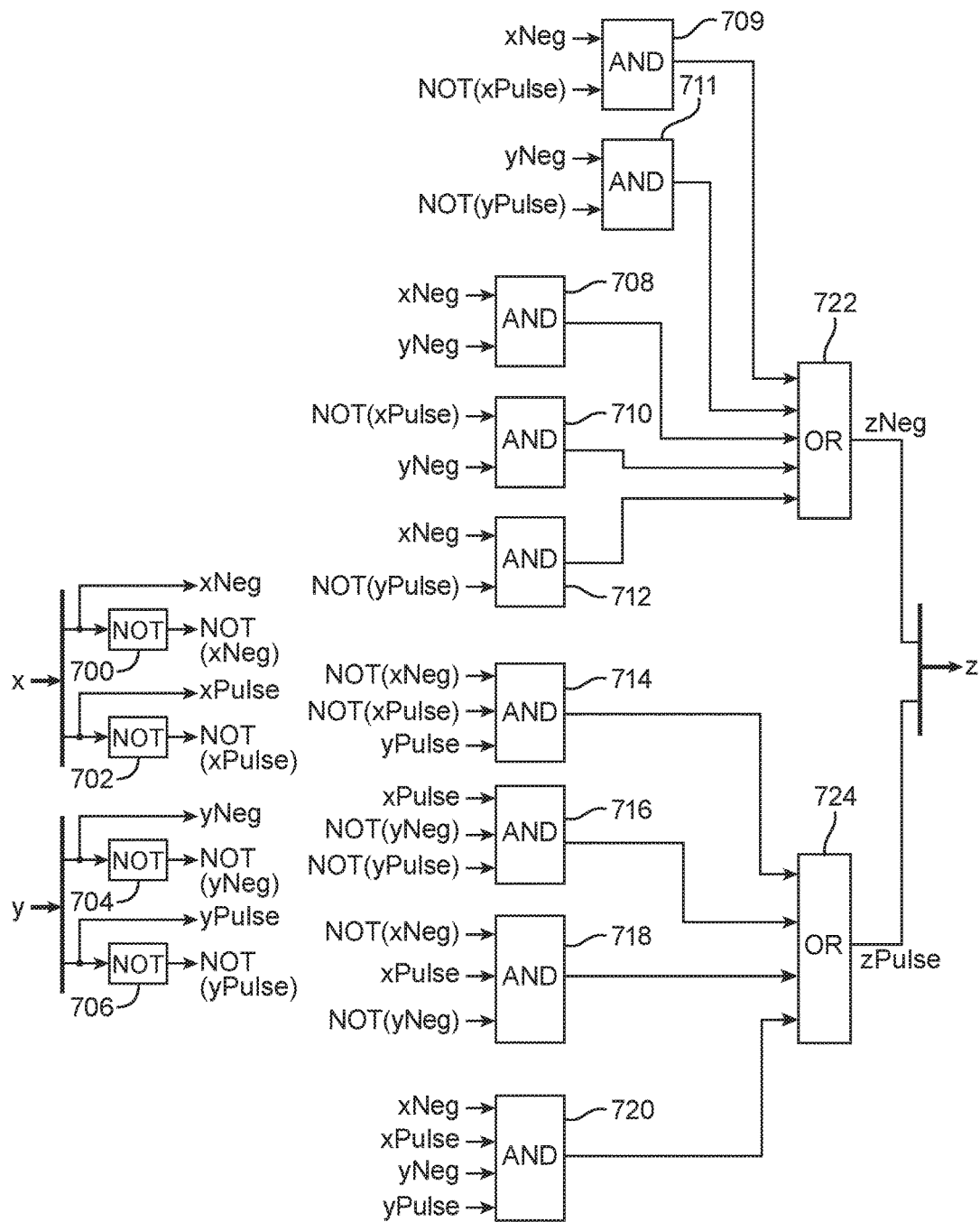
FIG. 7 is a diagram of an illustrative pulse density signal summing logic circuit in accordance with an embodiment.

FIG. 7 is a diagram of an illustrative pulse density signal addition logic 500. As shown in FIG. 7, logic 500 may have a first input that receives a first pulse density signal x from pulse density signal generator 310 and a second input that receives a second pulse density signal y via feedback path 306 (see, e.g., FIG. 5). First input signal x may be split into its sign component xNeg and pulse component xPulse. Similarly, second input signal y may be split into its sign component yNeg and pulse component yPulse. Both components of signal x may be inverted using NOT circuits 700 and 702 to generate NOT(xNeg) and NOT(xPulse), respectively. Similarly, both components of signal y may be inverted using NOT circuits 704 and 706 to generate NOT(yNeg) and NOT(yPulse), respectively. These signals may be passed through to a second stage of logic 500 described below.

The sign bit component zNeg for the overall summed output z may be computed according to the following expression:

$$z\text{Neg}=(x\text{Neg AND NOT}(x\text{Pulse})) \text{ OR } (y\text{Neg AND NOT}(y\text{Pulse})) \text{ OR } (x\text{Neg AND } y\text{Neg}) \text{ OR } (\text{NOT}(x\text{Pulse}) \text{ AND } y\text{Neg}) \text{ OR } (x\text{Neg AND NOT}(y\text{Pulse})) \quad (1)$$

Expression (1) may implemented using logic AND gates 708-712 and logic OR gate 722 in FIG. 7. Logic AND gate 709 receives signals xNeg and NOT(xPulse). Logic AND gate 711 receives signals yNeg and NOT(yPulse). Logic AND gate 708 receives signals xNeg and yNeg. Logic AND gate 710 receives signals NOT(xPulse) and yNeg. Logic AND gate 712 receives signals xNeg and NOT(yPulse). The outputs of gates 708-712 may be combined using logic OR gate 722, which generates signal zNeg at its output.

The pulse component zPulse for output z may be computed using the following expression:

$$z\text{Pulse}=(\text{NOT}(x\text{Neg}) \text{ AND NOT}(x\text{Pulse}) \text{ AND } y\text{Pulse}) \text{ OR } (x\text{Pulse AND NOT}(y\text{Neg}) \text{ AND NOT}(y\text{Pulse})) \text{ OR } (\text{NOT}(x\text{Neg}) \text{ AND } x\text{Pulse AND NOT}(y\text{Neg})) \text{ OR } (x\text{Neg AND } x\text{Pulse AND } y\text{Neg AND } y\text{Pulse}) \quad (2)$$

Expression (2) may be implemented using logic AND gates 714, 716, 718, and 720 and logic OR gate 724 in FIG. 7. Logic AND gate 714 may be configured to receive signals NOT(xNeg), NOT(xPulse), and yPulse. Logic AND gate 716 may be configured to receive signals xPulse, NOT(yNeg), and NOT(yPulse). Logic AND gate 718 may be configured to receive signals NOT(xNeg), xPulse, and NOT(yNeg). Logic AND gate 720 may be configured to receive signals xNeg, xPulse, yNeg, and yPulse. The outputs of gates 714, 716, 718, and 720 may be combined using logic OR gate 724, which generates signal zPulse at its output.

Pulse density control signal z, which includes components zNeg and zPulse, generated in this way may be optionally amplified by a gain factor and may be used to control the dynamic subsystem under test. In accordance with another embodiment, a gain or multiplication operation on signed pulse density signals can be computed as follows. To compute product p that is equal to pulse density signal z times pulse density signal g, z is split into {zNeg, zPulse} while g can be split into {gNeg, gPulse}. The new sign bit of pNeg can then be computed by taking the exclusive-OR of zNeg and pNeg (i.e., pNeg=XOR(zNeg, pNeg)). In other words, pNeg is equal to a one if zNeg and gNeg have opposite polarities or is equal to zero when both have the same value. Signal pPulse can be calculated by ANDing together zPulse and gPulse (i.e., pPulse=AND(zPulse, gPulse)). To multiply a pulse density signal by a gain of more than one, the signal can be multiplied by an integer and then multiplied by another fractional value, if necessary. Multiplying a pulse density signal by an integer n can be done by designing logic to hold each input pulse high for n cycles instead of only one cycle (as an example).

The example of FIG. 7 shows merely one way of implementing the logic addition function. If desired, other ways of implementing a fast signed/unsigned summing circuit may also be employed. The use of simple digital logic gates to perform these computations enables the feedback control system to process the various pulse density signal streams with low latency and low noise.

Figure 8:
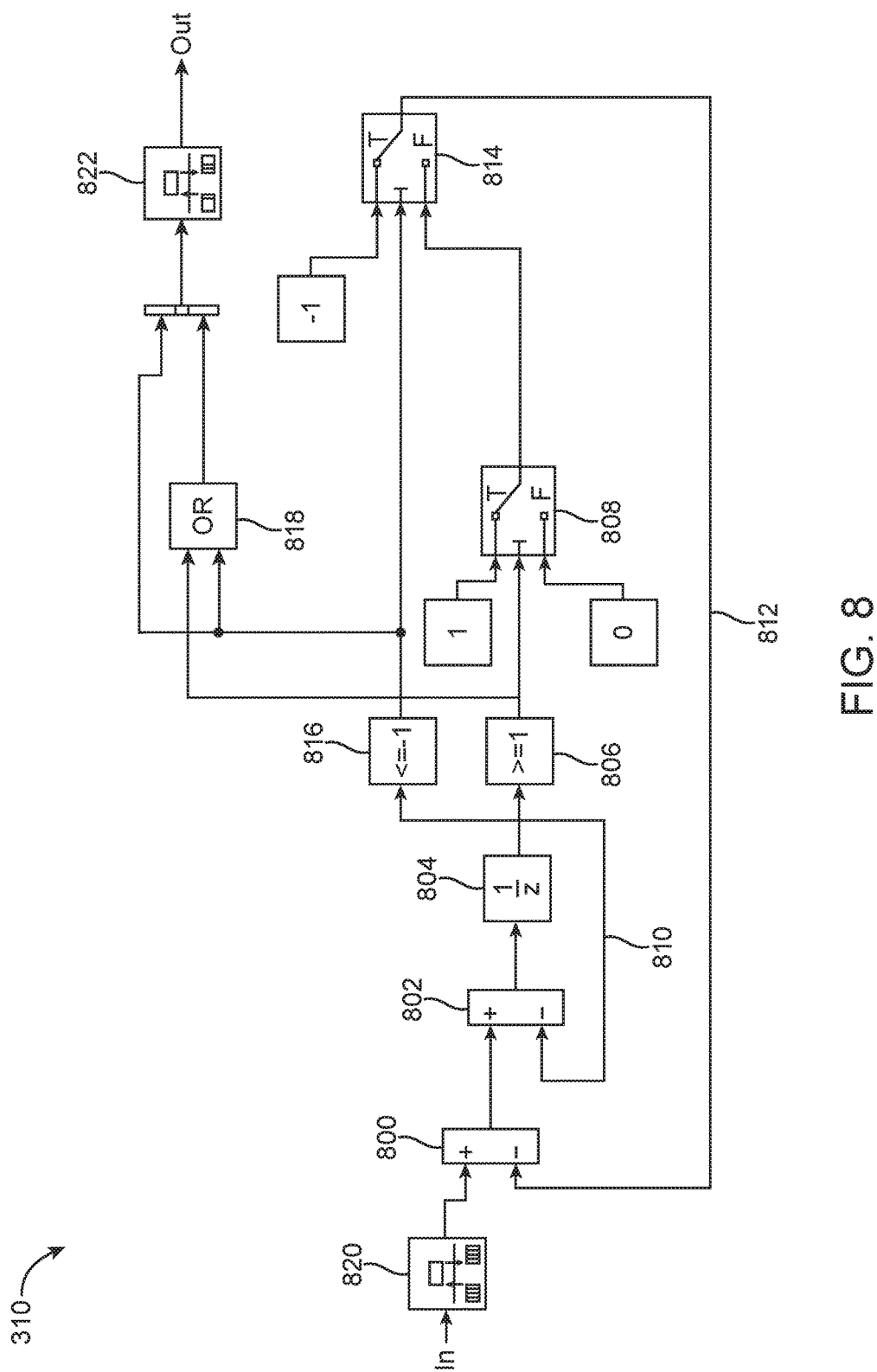
FIG. 8 is a diagram of an illustrative pulse signal generator circuit in accordance with an embodiment.

FIG. 8 is a diagram of pulse signal generator 310 circuit in accordance with an embodiment. As shown in FIG. 8, pulse signal generator 310 may include a subtraction circuit 800, an adder circuit 802, a unit delay circuit 804, a first threshold comparison circuit 806 that controls a first switching circuit 808, a second threshold comparison circuit 816 that controls a second switching circuit 814, a logic OR gate 818, and rate transition circuits 820 and 822. Pulse signal generator 310 has an input port that receives an input command signal such as input signal In and an output port at which output signal Out is provided. Signal In may be fed through first rate transition circuit 820, which changes the clocking rate by some integer to help avoid correlation between different pulse density signal streams. In the example of FIG. 8, signal In may be a multibit signed value.

Subtraction circuit 800 may have a first (+) input that receives the input signal from rate transition circuit 820, a second (−) input that receives a first feedback signal via path 812, and an output. Adder 802 may have a first input that receives signals from the output of subtraction circuit 800, a second input that receives a second feedback signal via path 810, and an output that is coupled to unit delay circuit 804. Unit delay circuit 804 has an output that feeds into threshold comparison circuit 806. Threshold comparison circuit 806 may be configured to compare the value at the output of unit delay circuit 804 to a predetermined threshold value of one (as an example). Threshold comparison circuit 806 may have an output that can be used to control feedback switch 808. Depending on the result of circuit 806, switch 808 may either pass through a zero or the threshold (Th) value of one switch 814.

The output of unit delay circuit 804 may also feed into second threshold comparison circuit 816. Threshold comparison circuit 816 may be configured to compare the value at the output of unit delay circuit 804 to a predetermined threshold value of negative one (as an example). Circuit 806 sends a positive pulse only when the integral value exceeds the positive threshold value in circuit 806, while circuit 816 sends a negative pulse only when the integral value is less than the negative threshold value in circuit 816. Threshold comparison circuit 816 may have an output that can be used to control feedback switch 814. Depending on the result of circuit 816, switch 814 may either pass through a negative one or the value routed from switch 808. The output of switch 814 may be coupled to the second (−) input of circuit 800 via path 812.

The sign component of signal Out may be provided at the output of threshold comparison circuit 816. The pulse component of signal Out may be obtained by ORing the outputs of circuits 806 and 816 (e.g., using logic OR gate 818). Both the signed component and the pulse component may be merged into a single bus and then fed through second rate transition circuit 822 to the output port of generator 310. Similar to first rate transition circuit 820, second rate transition circuit 822 also helps to ensure that different pulse density signals are uncorrelated.

Figure 9:
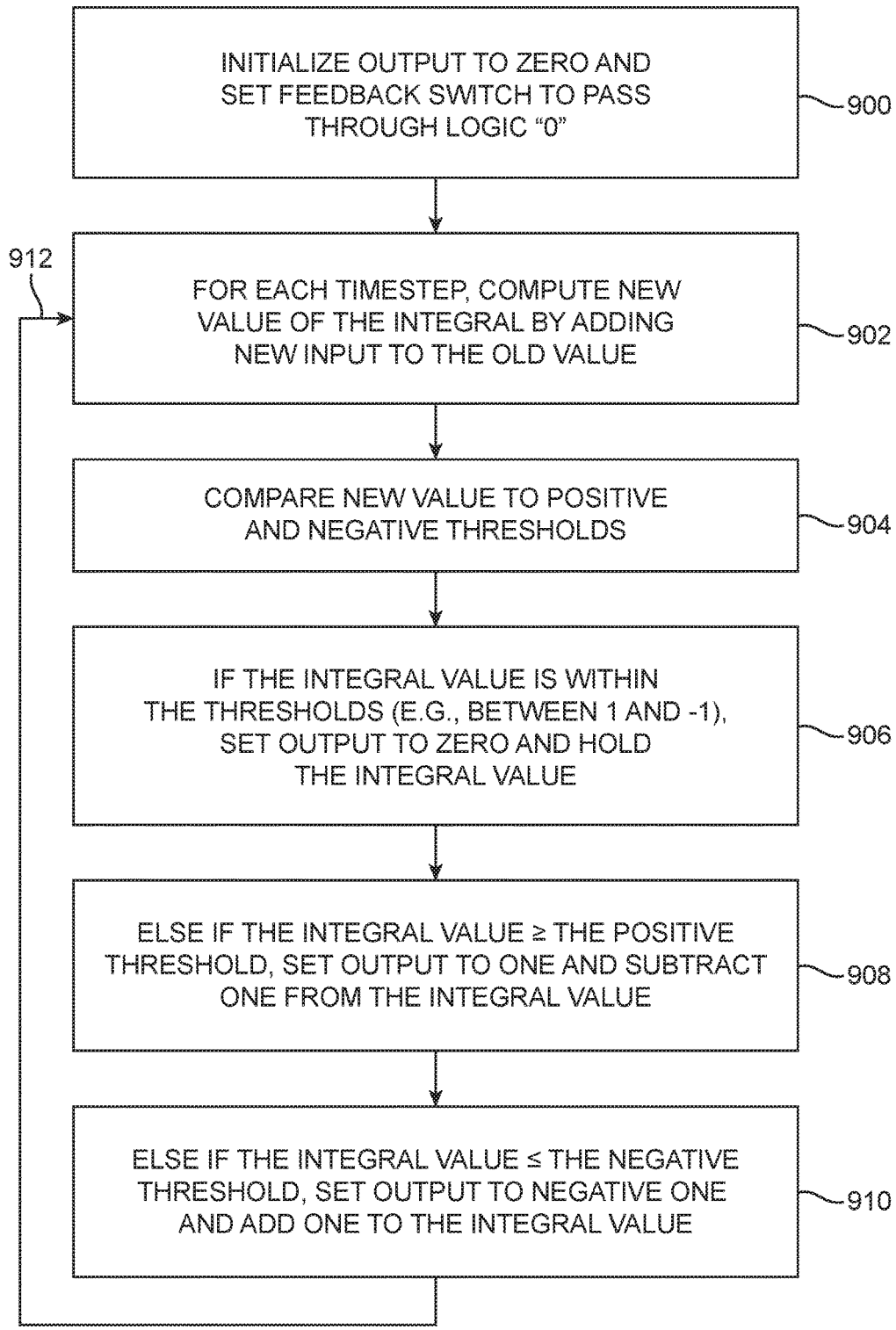
FIG. 9 is a flow chart of illustrative steps for operating the pulse signal generator circuit of FIG. 8 in accordance with an embodiment.

FIG. 9 is a flow chart of illustrative steps for operating a pulse signal generator circuit 310 of the type shown in FIG. 8. At step 900, output signal Out may be initialized to zero and feedback switch 808 may be configured to pass through a logic "0" to feedback path 812.

At each new time step of the input signal, a new value of the integral may be computed by adding the new input signal to the previous value held at the output of circuit 804 (step 902). The inner loop consisting of circuits 802 and 804 and feedback loop 810 therefore serves to provide an integrating function.

At step 904, the newly computed value may be compared to predetermined positive and negative threshold values (e.g., to +1 and −1). If the newly computed integral value is within the threshold values (e.g., if the integral value is less than one and greater than negative one), signal Out may be set to zero and the integral value remains held at the output of circuit 804 (at step 906).

Else if the integral value is greater than or equal to the positive threshold (e.g., if the integral value exceeds +1), signal Out may be set to one and the integral value may be decreased by one (at step 908). Else if the integral value is less than or equal to the negative threshold (e.g., if the integral value falls below −1), signal Out may be set to negative one and the integral value may be increased by one (at step 910). Processing may then loop back to step 902, as indicated by path 912.

Operated and arranged in this way, pulse signal generator 310 can be used to generate signed pulse density signals whenever the input bits accumulate up to a value that exceeds the predetermined thresholds. These techniques can also be simplified to support unsigned pulse density operations.

In accordance with another embodiment, a pulse density signal k can also be encoded as follows:

{0,0}=0

{0,1}=+1

{1,0}=−1

{1,1}=NaN (Not a Number)

Encoded in this way, k is represented as {NegPulse, PosPulse}. This encoding could result in simpler logic operations due to the symmetric nature of the encoding. Changes to controller logic 312 to support this type of encoding can be derived by a person having ordinary skill in the art without undue experimentation.

Figure 10:
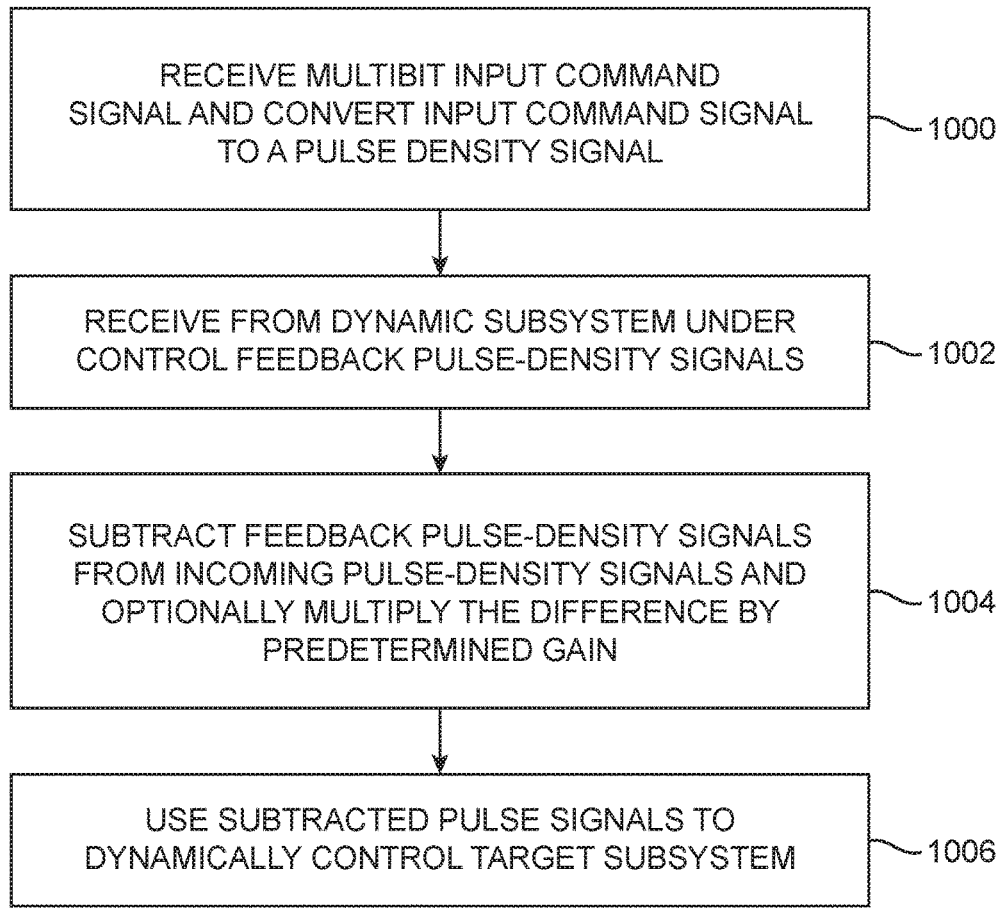
FIG. 10 is a flow chart of illustrative steps for operating a pulse density signal based feedback control system of the type shown in connection with FIGS. 3-9 in accordance with an embodiment.

FIG. 10 is a flow chart of illustrative steps for operating a pulse density signal based feedback control system of the type shown in connection with FIGS. 3-9 in accordance with an embodiment.

At step 1000, pulse density signal generator 310 may receive a multibit input command signal and convert the input command signal into a pulse density signal (e.g., a stream of zeros and ones). At step 1002, controller logic 312 may receive the stream of pulse density signals from pulse density signal generator 310 and also feedback pulse density signals from the dynamic subsystem under control (i.e., from the plant).

At step 1004, controller logic 312 may then subtract the feedback pulse density signals from the input pulse density signals and optionally amplify the difference by a predetermined gain. At step 1006, the resulting pulse density control error signals may be used to dynamically control the target subsystem under control. The feedback control system may continue to operate in this way to ensure that the dynamic subsystem under control exhibits the desired performance parameter as specified by the input command signal.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA/INTEL Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art. The foregoing embodiments may be implemented individually or in any combination.

What is claimed is:

1. A feedback control system, comprising:
   a dynamic subsystem under control; and
   a feedback controller that controls the dynamic subsystem under control and that receives feedback signals from the dynamic subsystem under control, wherein the dynamic subsystem under control receives pulse density control signals from the feedback controller, wherein the feedback controller includes a pulse density signal generator that outputs pulse density input signals, wherein the pulse density signal generator comprises a data converter, and wherein the feedback controller further includes a controller logic circuit that receives the pulse density input signals from the pulse density signal generator and the feedback signals from the dynamic subsystem under control.

2. The feedback control system of claim 1, wherein the feedback controller comprises an integrated circuit die.

3. The feedback control system of claim 1, wherein the data converter comprises a sigma-delta converter.

4. The feedback control system of claim 1, wherein the controller logic circuit comprises:
   an addition logic circuit; and
   a sign change logic circuit.

5. The feedback control system of claim 4, wherein the addition logic circuit performs a summing function using logic OR gates.

6. The feedback control system of claim 4, wherein the addition logic circuit performs a multiply function using logic AND gates.

7. The feedback control system of claim 1, wherein the feedback controller includes a rate transition circuit that ensures that the pulse density input signals and the feedback signals are uncorrelated.

8. The feedback control system of claim 1, wherein the feedback controller is configured to compute a difference between the pulse density input signals and the feedback signals and to amplify the difference by a predetermined gain value.

9. The feedback control system of claim 1, wherein the pulse density control signals include a sign bit component.

10. A method for operating a feedback control system, comprising:
    with a feedback controller, receiving input command signals;
    with the feedback controller, controlling a dynamic subsystem under control based on the input command signals by outputting pulse density control signals, wherein the pulse density control signals are received at the dynamic subsystem under control;
    with the feedback controller, receiving feedback signals from the dynamic subsystem under control;
    with an analog-to-digital converter, receiving analog signals from the dynamic subsystem under control and outputting the feedback signals to the feedback controller;
    with a pulse density signal generator in the feedback controller, receiving the input command signals and outputting pulse density input signals; and
    with a controller logic circuit in the feedback controller, receiving the input command signals from the pulse density signal generator and the feedback signals from the analog-to-digital converter and outputting the pulse density control signals to the dynamic subsystem under control.

11. An integrated circuit die, comprising:
    an input that receives an input command signal;
    a pulse density signal generator that receives the input command signal and that generates a corresponding pulse density input signal; and
    a controller logic that receives the pulse density input signal from the pulse density signal generator, that receives a feedback signal from an external dynamic subsystem under control, and that outputs corresponding a pulse density control signal for controlling the dynamic subsystem under control, wherein the pulse density signal generator includes a rate transition circuit that ensures that the pulse density input signal and the feedback signal are uncorrelated.

12. The integrated circuit die of claim 11, wherein the controller logic is implemented using reconfigurable logic circuits within the integrated circuit die.

13. The integrated circuit die of claim 11, wherein the pulse density signal generator comprises a sigma-delta data converter.

14. The integrated circuit die of claim 11, wherein the pulse density signal generator outputs a signed pulse density input signal.

* * * * *